METHOD FOR PLATING CONDUCTIVE PATTERNS WITH HIGH RESOLUTION

Filed Feb. 14, 1967 2 Sheets-Sheet 1

INVENTORS
RICHARD L. GARWIN
ARTHUR S. NOWICK
BY Bernard N. Wiener
ATTORNEY

United States Patent Office 3,506,545
Patented Apr. 14, 1970

3,506,545

METHOD FOR PLATING CONDUCTIVE PATTERNS WITH HIGH RESOLUTION

Richard L. Garwin and Arthur S. Nowick, Scarsdale, N.Y., assignors to International Business Machines Corporation, Armonk, N.Y., a corporation of New York Filed Feb. 14, 1967, Ser. No. 616,094
Int. Cl. C23b *5/48*
U.S. Cl. 204—15 8 Claims

ABSTRACT OF THE DISCLOSURE

A solid state material is used as an electroplate substrate which has both amorphous and crystalline states possible at ambient temperature. By heating the amorphous substrate locally via a focused and programmed electron beam or laser beam, a line of demarcation is obtained in the substrate between regions which remain in the amorphous state and regions which are transformed to the crystalline state with higher conductivity. The transformation of contiguous regions permits preferentially electroplating of metallic conductive patterns on the higher conductivity region which effectively short circuits the underlying electroplate substrate.

INTRODUCTION

This invention relates generally to a method for plating a pattern, and it relates more particularly to a method for establishing conductive patterns with higher resolution on a semiconductive material.

In the art of electronic circuitry, it is important that conductive paths be established between predetermined points on a substrate. Such conductive paths are especially useful in integrated circuits where it is desirable that they be readily established and finely demarcated. Of special importance for such conductive paths is that they interconnect points on the substrate and short circuit the underlying portion of the substrate. If such short circuit does occur, the underlying portion of the substrate can itself serve a beneficial function in the performance of the circuit configuration of which the conductive path forms a part.

It has been determined for the practice of this invention, based on data in the literature, that the Fermi level in an amorphous semiconductor is pinned by the large number of defects that are present in the structure of this material. Therefore, the Fermi level cannot be varied through the presence of donor or acceptor impurities in the same way as this level is conventionally varied in the crystalline material. A dopant is thus relatively ineffective in an amorphous semiconductor material for altering its conductivity by comparison to a crystalline semiconductor material with the same dopant concentration. Background literature concerning the effect of different dopant concentrations on the conductivities of a semiconductor material in the crystalline state includes the following:

(a) The book Modern Physics, 2nd ed., R. L. Sproull, John Wiley and Sons, Inc., 1963, p. 398, table of data entitled "Conductivity of n and p-type germanium."

(b) The article "Electrical Properties of N-Type Germanium," P. P. Debye et al., Physical Review, vol. 93, 1954, pp. 693–706.

An amorphous material lacks a periodic structure of its atomic components and is of the nature of a supercooled liquid. Some amorphous materials, e.g., Ge and Si, remain so at ambient temperature, e.g., 20° C., unless a considerably excess heat is added thereto which causes it to become transformed to a crystalline state. The following are exemplary background articles concerning amorphous semiconductors:

(a) "Non-Crystalline Amorphous, and Liquid Electronic Semiconductors," A. F. Ioffe et al., Progress in Semiconductors, vol. 4, John Wiley and Sons, Inc., 1960, pp. 230–291.

(b) "Study of Short Range Order in Amorphous Semiconductors by the Electron Diffraction Method," L. I. Tatarinova, Soviet Physics-Crystallography, vol. 4, No. 5, September–October 1959, pp. 678–683.

(c) "Sur les Properties Electriques de Couches Minces de Germanium," M. P. M. Dunoyer, Journal de Physique, vol. 17, May 1951, pp. 602–606.

OBJECTS

It is an object of this invention to provide a conductive pattern on a substrate.

It is another object of this invention to provide a configuration of conductive paths on an amorphous substrate with high resolution.

It is another object of this invention to provide demarcated zones of a material in one conductive state adjacent zones of the material in another conductive state with a conductive path established on one of the zones of higher conductivity than that of either of the zones.

It is another object of this invention to utilize metallurgical and energetic beam technologies to establish extremely small and shaped conductive patterns on demarcated zones of a substrate.

It is another object of this invention to utilize semiconducting doping, energetic beam heating, and electroplating techniques to establish conductive paths on an amorphous substrate.

It is another object of this invention to provide a configuration of metallic conductive paths on a semiconductor substrate wherein the paths are established on crystalline regions by electroplating and the crystalline region itself is established in the substrate from a preconditioned amorphous state by a traversing energetic beam such as an electron beam or a laser beam.

The foregoing and other objects, features, and advantages of the invention will be apparent from the following more particular description of a preferred embodiment of the invention, as illustrated in the accompanying drawings.

DESCRIPTION OF INVENTION

Generally, this invention provides conductive paths on a substrate by defining the locales for these conductive paths by a traversing energetic beam such as an electron beam or a laser beam. After the substrate is thus sensitized to different conductivities in adjacent regions, an electroplating bath is utilized to establish a metallic deposition preferentially on the portion having the greatest conductivity. With greater particularity, this invention provides a conductive pattern with high resolution on an amorphous substrate of semiconductor material through utilizing traversal thereon of a finely focused electron beam or laser beam which transforms by local heating amorphous material to crystalline material. As the crystalline material can have a much higher conductivity than the amorphous material and the degree of conductivity differential between adjacent amorphous region and crystalline region can be controlled by the dopant concentration established during the growth of the amorphous layer, the electroplating of the conductive path configuration by metallic deposition on the substrate is readily controlled.

Since an electron beam is a stream of charged particles, it can be deflected controllably both by electrostatic and magnetic fields and can be focused in a conventional manner to heat regions down to dimensions of the order of one micron in diameter. Laser beams can also be used to heat a substrate locally. A conventional system for programmed deflection also is used with a laser beam. For both an electron beam and a laser beam in the practice of this invention, the programmed deflection can readily be obtained with a fixed direction beam on an electroplate substrate which is moved mechanically relative to the beam in the desired pattern.

Figures 1A, 1B, 2:
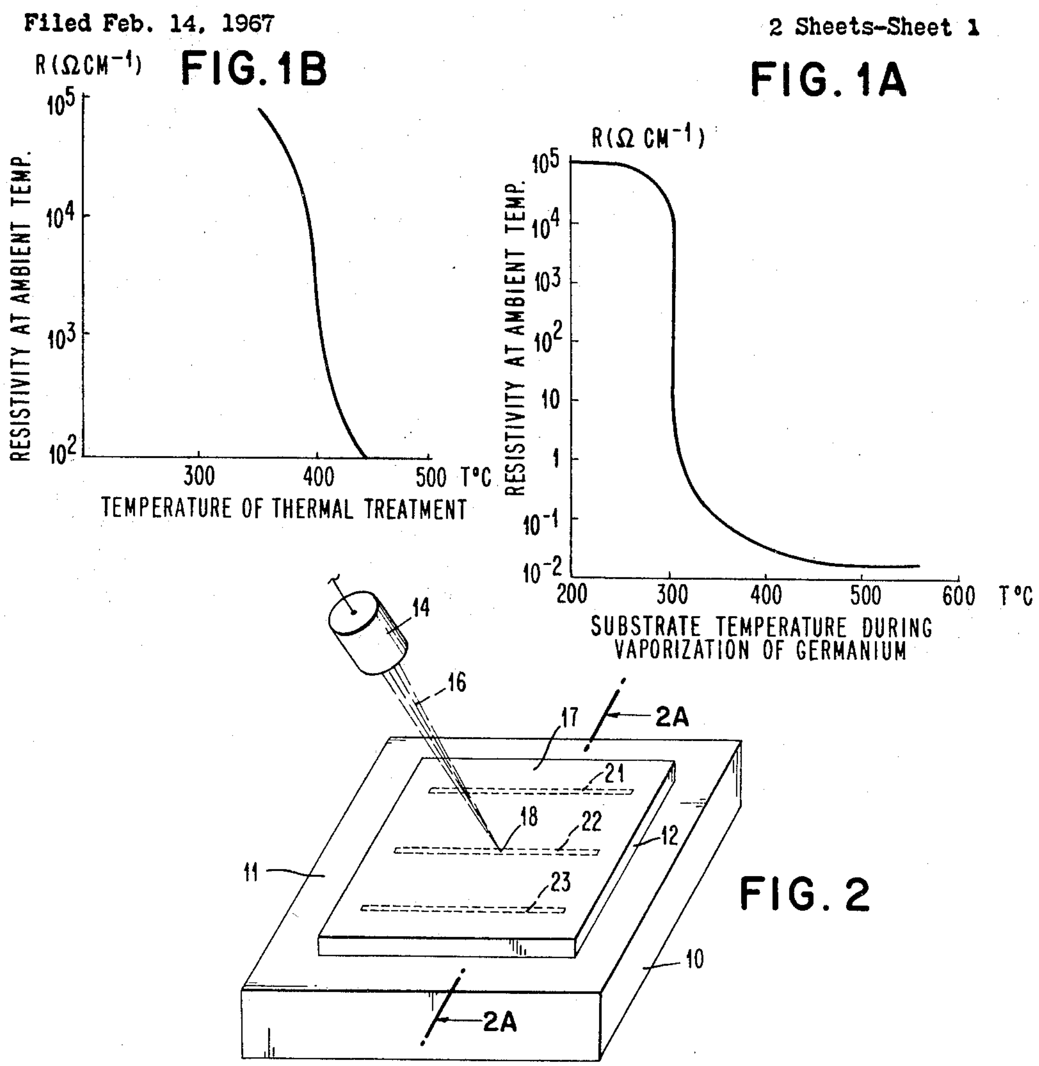
FIG. 1A is a graph of the resistivity of germanium with resistivity plotted versus temperature of the support substrate during vaporization of the germanium thereon, the resistivity being measured at ambient temperature.
FIG. 1B is a graph corresponding to the graph of FIG. 1A and shows resistivity of a sample of Ge measured at ambient temperature, which had been deposited at relatively low temperature, e.g., 250° C. and then heated to successively higher temperatures.
FIG. 2 is a schematic diagram illustrating the use of an electron beam focused and programmed for traversing a substrate of amorphous semiconductor to transform local regions therein to the crystalline state.

FIGS. 1A and 1B provide exemplary data concerning establishing a semiconductor film of germanium in the amorphous state and the transformation thereof to the crystalline state by heating. The data is from the noted article by M. J. M. Dunoyer, Journal de Physique, vol. 12, May 1951, pp. 602–606. As shown in FIG. 1A, the resistivity of germanium in the amorphous state is significantly different than it is in the crystalline state. There is a resistivity differential of a factor $10^7$ between the amorphous state and the crystalline state. FIG. 1B shows what temperature must be achieved to produce transformation of amorphous state Ge to the crystalline state. It is clear that temperatures of at least 425° C. are required and must therefore be attained during the heating by the electron beam or laser beam. The corresponding temperature for the transformation of amorphous Si to the crystalline state is somewhat higher than for Ge.

There are only two requirements for the preparation of suitable amorphous films for the practice of this invention beyond those for producing thin films of any material. One requirement is that a source be used which is the semiconductor of interest, and this starting material may be doped as desired. The second requirement is the maintenance of a support substrate temperature below a critical value at which the material becomes crystalline. Illustratively, in FIG. 1A the support substrate temperature during deposition of germanium thereon has a critical temperature of approximately 300° C. Clearly, any support substrate temperature below 250° C. will, during deposition of germanium, give rise to the amorphous state.

The doping of an amorphous semiconductor for the practice of this invention can be accomplished in several ways. One procedure involves simultaneous evaporation from two sources; source one containing the desired semiconductor and the other source containing the dopant. This procedure requires the use of rate monitoring devices to maintain the proper ratio between the two evaporations. Another procedure uses a source material which is already doped. In this case, the deposited film will have a different composition from the starting material due to the difference in vapor pressure between the semiconductor and the dopant. However, the starting composition can be adjusted taking this fact into account. An exemplary background text on evaporation of materials is: Vacuum Deposition of Thin Films, L. Holland, John Wiley and Sons, Inc., 1958.

Figure 2A:
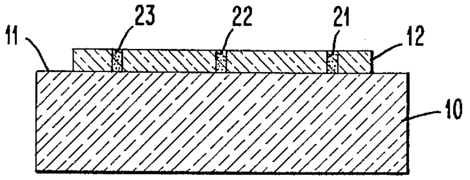

The practice of this invention for an embodiment thereof will now be described with reference to FIGS. 2 and 3 of which FIG. 2A is a cross-sectional view of the structure of FIG. 2.

There is shown in FIG. 2 a support substrate 10, e.g., of quartz, on the surface 11 of which there is vacuum deposited an amorphous layer 12 of Ge, i.e., an electroplate substrate, which maintains that state at ambient room temperature, e.g., 20° C. An illustrative thickness of the layer 12 is one micron. Layer 12 of Ge can be transformed from the amorphous state to the crystalline state by the suitable addition of heat. In the practice of the embodiment illustrated in FIG. 2, the substrate 10 and layer 12 thereon are established in a vacuum system having a vacuum in the range of $10^{-5}$ torr, where 1 torr equals a pressure of 1 mm. of Hg. An electron beam source 14 provides a focused electron beam 16 which is programmable on the surface 17 of layer 12 at points 18 therein. The electron beam 16 is programmed to traverse the surface 11 in paths 21 to 23 and to heat the surface so as to transform the amorphous state to the crystalline state. By cooling the substrate 10 in a conventional manner, heat added to the layer 12 for the transformation from the amorphous state to the crystalline state is rapidly dissipated by a diffusion thereof outside the pathway defined by the traversing electron beam without significant rise in temperature of the material outside the margin of the beam.

Exemplary background books and articles on electron beam technology are:

(a) The book, First International Conference on Electron and Ion Beam Science and Technology, R. Bakish, editor, particularly, "Some Observations on the Formation of Tracks on Thin Supported Metal Films Produced by an Electron Beam," P. A. Einstein, pp. 205–219.

(b) The book, Introduction to Electron Beam Technology, R. Bakish, editor, John Wiley and Sons, Inc., 1962.

(c) The article, "The Preparation of Microcircuit Stencils and Patterns by Photomechanics and Electron Beam Machinery," P. L. Hawkes et al., Journal of Microelectronics and Reliability, vol. 4, 1965, pp. 65–79.

As shown in FIG. 2A, the pathways 21 to 23 of transformed amorphous material to crystalline material penetrate completely the depth of layer 12. In some circumstances, for the practice of this invention, the amorphous material is transformed to crystalline material only partially in the entire depth of layer 12. It is usually not necessary to cool the support substrate 10 during heating of amorphous layer 10. If the support substrate is a good insulator, the heat from the beam does spread or diffuse significantly, which is sufficient to maintain a narrow zone being heated.

The amorphous layer 10 should be of such thickness that the crystalline regions produced through local heating are sufficient to carry the electroplating current and make possible the electroplating. In practice, it is sometimes difficult to achieve an amorphous film which is only partially converted in depth during the local heating to crystalline layer unless it has considerable thickness. It is preferable for the practice of this invention to convert the amorphous film 12 to crystalline material down to the surface 11 of the underlying support substrate 10 which if it is a good insulator, tends to localize the heated zone to the resolution of the heating beam at the point of junction, between amorphous layer 12 and support substrate 10. By having the support substrate 10 of thick material which is a very poor thermal conductor, heat is mainly retained near the heated junction of the semiconductor and insulator and the desired heating is achieved efficiently and in a localized manner.

Figure 3:
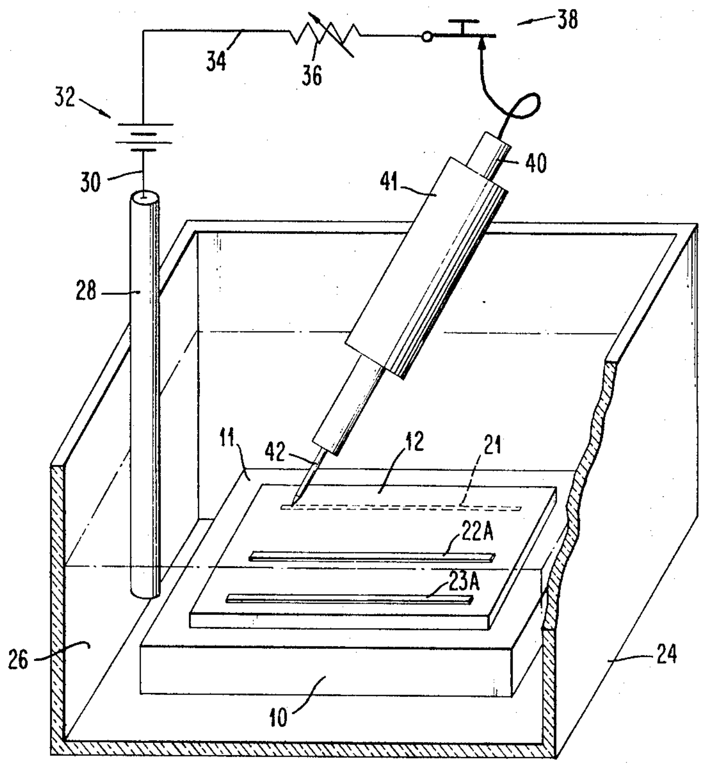
FIG. 3 is a schematic diagram showing the finished structure of FIG. 2 established in an electro-plating bath for electroplating a metallic conductive pattern on the crystalline regions in the amorphous substrate.

FIG. 3 is a schematic diagram of an electroplating bath for establishing by electroplating metallic conductive depositions on layer 12 at crystalline regions 21 to 23. The structure comprising substrate 10 and layer 12 thereon is established in container 24. A conventional electroplate bath 26, e.g., an aqueous cyanide solution, is established therein which is electroplating a metal on the crystalline region 21, e.g., copper or silver, on germanium. Conductive patterns 22A and 23A are shown as already deposited on crystalline regions 22 and 23. Exemplary background articles and books are:

(a) "Electroplating Metal Contacts on Germanium and Silicon," D. R. Turner; Journal of the Electrochemical Society, vol. 106, September 1959, pp. 786–790.

(b) Modern Electroplating, F. A. Lowenheim, editor, John Wiley and Sons, Inc., 1965.

(c) Electroplater's Process Control Handbook, D. G. Faulker et al., editors, Reinhold Corp., 1963.

In the practice of this invention, an anode 28 is connected to a battery 32. The negative terminal of battery 32 is connected via conductor 34, variable resistance 36, and switch connector 28 to conductive probe 40. An insulator mount 41 sustains firmly conductive probe 40 which has a sharp point contact 42 for contacting the surface of layer 12. As depicted in FIG. 3, the layer 12 has already had established thereon at regions 22 and 23 metallic depositions 22A and 23A. In order to establish a conductive metallic deposition on the crystalline region 21, probe 42 is caused to contact region 21, and a suitable current is caused to flow by adjustment of resistance 36. Since crystalline region 21 is of significantly greater conductivity than the adjacent amorphous regions, there is preferentially deposited thereon a metallic layer of uniform thickness.

Although the crystalline pathway 21 is of considerably greater conductivity than the adjacent amorphous regions, the metallic deposition established thereon by electroplating is of such higher conductivity that it effectively short circuits the underlying portion of layer 12. The crystalline material is effectively short circuited by the metal because the resistivity of the electroplated metal is in the range of $10^{-6}$ to $10^{-5}$ ohm-cm., while the crystalline semiconductor material can be limited to resistivity of $10^{-2}$ to $10^{-3}$ ohm-cm. The highly conductive metallic patterns 21A, 22A, and 23A are utilized in a conventional manner for communicating current or otherwise making contact between required positions on layer 12 after the structure consisting of substrate 10, layer 12, and the metallic depositions is removed from the electroplate bath 26.

Figure 4:
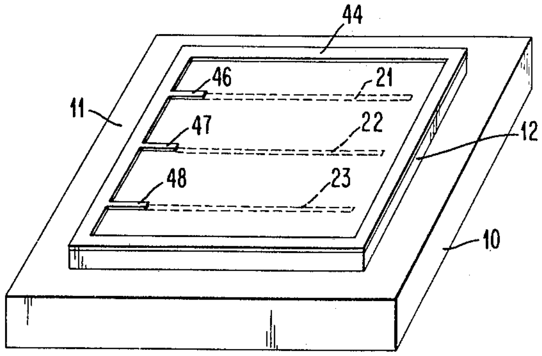
FIG. 4 is a schematic diagram illustrating a technique for making electrical contact with the crystalline regions in an electroplating bath by metallic connection plated on the amorphous layer.

FIG. 4 is a schematic diagram representing a technique for making a contact to crystalline pathways 21 to 23 in a special manner. A conductive metallic connection 44 is established on layer 12 in a conventional manner, e.g., by masking and vacuum deposition, with probes 46 to 48 which make contact respectively with crystalline pathways 21 to 23. The structure comprising substrate 10, layer 12, and conductive metallic connection 44 is then immersed in the electroplate bath 26 of FIG. 3, and the contact 42 of probe 40 is caused to make contact at some point with metallic pathway 44. Subsequently, the probe connection portions 46 to 48 are removed, as by etching, if they are not required for the operational performance for which the conductive patterns 21A to 23A are to be used.

SUMMARY OF THE INVENTION

Through the practice of this invention, conductive paths are established by plating, e.g., electroplating, on an insulating substrate. The substrate is characterized by at least two physical conditions between which there is a transformation through application of heat whereby regions adjacent a line of demarcation defined by the heating have sufficiently different conductivities that one preferentially receives the plate and the other does not.

In carrying out the pratcice of this invention, a substrate is provided which initially is an amorphous condition that remains so at ambient temperature of operation of any consequence device utilizing the substrate. The substrate should either be a good thermal insulator, e.g., fused quartz, or externally cooled so that heat absorbed in the substrate raises the temperature only locally. There is obtained a line of demarcation in the substrate separating one region of relatively high conductivity from another region of relatively low conductivity by applying a focused electron beam or laser beam of sufficient energy. Thereafter, the region of relatively high conductivity is electroplated by making it the cathode for electroplating of a metallic deposit. Illustratively, for semiconductor component technology with Si and Ge materials, an amorphous layer thereof is deposited on a substrate by conventional procedure; and it is exposed to a focused and programmed electron beam or laser beam which delineates a pattern in the substrate of transformed regions from the amorphous state to the crystalline state. Thereafter, the substrate with the delineated regions of crystalline material is established in an electroplating bath and a pattern of conductive stripes is established on the substrate over the crystalline regions. These conductive patterns may be used conventionally for communicating electrical paths between terminal positions on the substrate such as binding posts or active devices which are themselves grown by conventional techniques on the substrate. The conductivity of a semiconductor material such as Si or Ge is largely determined by the dopant concentration therein which causes it to be either n-type or p-type conductive material. The semiconductor Si or Ge has its conductivity significantly more affected by a given dopant concentration in the crystalline condition than in the amorphous condition. Therefore, by controllably doping the amorphous substrate during its deposition, through the procedure of this invention, the effective conductivity differential between adjacent amorphous material and crystalline material may be controlled.

In the practice of this invention for integrated circuitry, the amorphous electroplate substrate may also be established as a region having the desired circuitry of active and passive components. The conductive paths obtained by the practice of this invention provide the desired conductive interconnections among the components.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. Method of establishing a pattern of current conductive interconnection metallic paths on a substrate comprising the steps of:

doping controllably and forming an amorphous layer of semiconductor material on a substrate, said amorphous material being effectively nonconductive for electroplating current;

heating locally said layer by a radiation beam to transform permanently by a phase transformation said amorphous material thereat to crystalline material adjacent lines of demarcation therein defining a pattern, said crystalline material being effectively conductive for electroplating current; and electroplating preferentially metallic depositions on said crystalline material of higher conductivity than either said amorphous material or said crystalline material to establish said pattern of current conductive interconnection metallic paths.

2. Method as set forth in claim 1 wherein said radiation beam is an electron beam.

3. Method as set forth in claim 1 wherein said radiation beam is a laser beam.

4. Method as set forth in claim 1 wherein said semiconductor material is germanium.

5. Method as set forth in claim 1 wherein said semiconductor material is silicon.

6. Method of establishing a pattern of current conductive interconnection metallic paths on a substrate comprising the steps of:

forming an amorphous layer of semiconductor material on a substrate, said amorphous material being effectively nonconductive for electroplating current;

heating locally said layer by a radiation beam to transform permanently by a phase transformation said amorphous material thereat to crystalline material adjacent lines of demarcation therein defining a pattern, said crystalline material being effectively conductive for electroplating current; and electroplating preferentially metallic depositions on said crystalline material of higher conductivity than either said amorphous material or said crystalline material to establish said pattern of current conductive interconnection metallic paths.

7. Method as set forth in claim 6 wherein said radiation beam is an electron beam.

8. Method as set forth in claim 6 wherein said radiation beam is a laser beam.

References Cited

UNITED STATES PATENTS

| | | | |
|---|---|---|---|
| 3,013,955 | 12/1961 | Roberts | 204—15 |
| 3,345,274 | 10/1967 | Schmidt | 204—15 |
| 3,397,278 | 8/1968 | Pomerantz | 204—15 |

FOREIGN PATENTS

| | | |
|---|---|---|
| 1,295,071 | 7/1961 | France. |
| 998,386 | 7/1965 | Great Britain. |

JOHN H. MACK, Primary Examiner

T. TUFARIELLO, Assistant Examiner